United States Patent
Baek et al.

(10) Patent No.: US 8,294,167 B2
(45) Date of Patent: Oct. 23, 2012

(54) LIGHT EMITTING DIODE WITH HIGH ELECTROSTATIC DISCHARGE AND FABRICATION METHOD THEREOF

(75) Inventors: Jong-Hyeob Baek, Daejeon (KR); Sang-Mook Kim, Gwangju (KR); Sang-Hern Lee, Busan (KR); Seung-Jae Lee, Jeollabuk-do (KR); Jung-Geun Jhin, Seoul (KR); Yoon-Seok Kim, Seoul (KR); Hong-Seo Yom, Seoul (KR); Young-Moon Yu, Daejeon (KR)

(73) Assignee: Korea Photonics Technology Institute (KR)

(*) Notice: Subject to any disclaimer, the term of this patent is extended or adjusted under 35 U.S.C. 154(b) by 267 days.

(21) Appl. No.: 12/523,396

(22) PCT Filed: Jan. 15, 2008

(86) PCT No.: PCT/KR2008/000257
§ 371 (c)(1),
(2), (4) Date: Aug. 6, 2010

(87) PCT Pub. No.: WO2008/088165
PCT Pub. Date: Jul. 24, 2008

(65) Prior Publication Data
US 2010/0295087 A1    Nov. 25, 2010

(30) Foreign Application Priority Data
Jan. 16, 2007  (KR) .................. 10-2007-0004582

(51) Int. Cl.
*H01L 33/00*     (2010.01)
*H01L 23/48*     (2006.01)
*H01L 23/52*     (2006.01)
*H01L 29/40*     (2006.01)
*H01L 21/00*     (2006.01)

(52) U.S. Cl. .............. 257/98; 257/96; 257/99; 257/745; 257/E33.005; 257/E33.043; 257/E33.044; 257/E33.064; 257/E33.066; 438/29; 438/47; 438/710

(58) Field of Classification Search .................. None
See application file for complete search history.

(56) References Cited

U.S. PATENT DOCUMENTS

| | | | | |
|---|---|---|---|---|
| 3,576,586 | A * | 4/1971 | Ross ............................ | 347/225 |
| 5,914,501 | A * | 6/1999 | Antle et al. .................. | 257/99 |
| 6,054,716 | A * | 4/2000 | Sonobe et al. ............... | 250/552 |
| 6,897,489 | B1 * | 5/2005 | Peng et al. ................... | 257/96 |
| 7,064,353 | B2 * | 6/2006 | Bhat ............................ | 257/79 |

(Continued)

FOREIGN PATENT DOCUMENTS

JP            06151958        * 5/1994
(Continued)

*Primary Examiner* — Hoang-Quan Ho
(74) *Attorney, Agent, or Firm* — Baker & Hostetler LLP

(57) ABSTRACT

The present invention relates to a light emitting diode with high electrostatic discharge and a fabrication method thereof, and more specifically to a light emitting diode comprising a first electrode layer provided over a upper surface of a first semiconductor layer and a upper surface of a second semiconductor layer; a transparent electrode layer formed on the upper surface of the second semiconductor layer, spaced from the first electrode layer; and a second electrode layer provided on a upper surface of the transparent electrode layer. With the present invention, there is provided a light emitting diode element with resistance against electrostatic discharge and with high reliability being strong against electrical impact, by selecting a structure arranging a form of an electrode differently from a conventional electrode.

13 Claims, 5 Drawing Sheets

U.S. PATENT DOCUMENTS

| | | | |
|---|---|---|---|
| 7,129,528 B2 * | 10/2006 | Bader et al. | 257/98 |
| 7,154,149 B2 * | 12/2006 | Wu et al. | 257/355 |
| 7,173,288 B2 * | 2/2007 | Lee et al. | 257/94 |
| 7,199,398 B2 * | 4/2007 | Ono et al. | 257/66 |
| 7,411,221 B2 * | 8/2008 | Cho et al. | 257/79 |
| 7,501,660 B2 * | 3/2009 | Schmid et al. | 257/81 |
| 7,714,348 B2 * | 5/2010 | Fan et al. | 257/99 |
| 8,110,835 B2 * | 2/2012 | Kumar et al. | 257/79 |
| 2002/0043331 A1 * | 4/2002 | Uemura et al. | 156/275.5 |
| 2004/0113167 A1 * | 6/2004 | Bader et al. | 257/98 |
| 2006/0014429 A1 * | 1/2006 | Schmid et al. | 439/596 |
| 2007/0030611 A1 * | 2/2007 | Cho et al. | 361/58 |
| 2008/0230794 A1 * | 9/2008 | Yasuda et al. | 257/96 |
| 2009/0206357 A1 * | 8/2009 | Ito et al. | 257/99 |
| 2009/0212316 A1 * | 8/2009 | Braune et al. | 257/99 |
| 2010/0295087 A1 * | 11/2010 | Baek et al. | 257/99 |

FOREIGN PATENT DOCUMENTS

| | | |
|---|---|---|
| JP | 10135519 A | 5/1998 |
| JP | 10308532 A | 11/1998 |
| JP | 11340514 A | 12/1999 |
| JP | 13044498 A | 2/2001 |
| WO | WO2005086243 A1 * | 9/2005 |

* cited by examiner

LIGHT EMITTING DIODE WITH HIGH ELECTROSTATIC DISCHARGE AND FABRICATION METHOD THEREOF

CROSS-REFERENCE TO RELATED APPLICATIONS

This application is a National Stage of International patent application PCT/KR2008/000257, filed on Jan. 15, 2008, which claims priority to foreign application KR 10-2007-0004582, filed on Jan. 16, 2007, the disclosures of which are incorporated herein by reference in their entirety.

TECHNICAL FIELD

The present invention relates to a light emitting diode with high electrostatic discharge and a fabrication method thereof, and more specifically to a light emitting diode comprising a first electrode layer provided extending over a upper surface of a first semiconductor layer and a upper surface of a second semiconductor layer; a transparent electrode layer formed on the upper surface of the second semiconductor layer, spaced from the first electrode layer; and a second electrode layer provided on a upper surface of the transparent electrode layer. Also, the present invention provides a fabrication method of a light emitting diode sequentially forming them and performing a plasma treatment or an oxidation treatment on the second semiconductor layer exposed, spaced between the first electrode layer and the second electrode layer.

BACKGROUND ART

In modern society, a light emitting diode (hereinafter, referred to as 'LED') has been used as a backlight unit (BLU) for a cellular phone, a backlight unit (BLU) for a LCD TV, and an optical treatment purpose, in an optical source for display, or has been actively entered into the market. Also, from now on an application field of the LED will gradually be widen even to a general illumination field such as an incandescent lamp or a fluorescent lamp so that the age of a semiconductor illumination has been expected to come in near future.

Generally, if the LED applies current to a single-layer chip or a multi-layer chip, electron-hole pairs excited in semiconductor layers and light emitting layers such as active layers provided between the semiconductor layers are combined to emit electric energy as light energy.

Therefore, a stacked structure of the LED where semiconductor layers doped with different types of impurities are sequentially stacked and the active layers are stacked therebetween has a form that electrode layers having types each corresponding to types of semiconductor layers are formed on regions of the semiconductor layers so as to connect to a power supply.

A sapphire substrate is mainly used as a substrate, and different types of semiconductor layers form a PN junction, wherein a light emitting layer may exist between a p-type semiconductor layer and an n-type semiconductor layer.

Meanwhile, since resistance of the p-type semiconductor layer is high, a transparent electrode layer having excellent conductivity may be stacked on an upper part of the p-type semiconductor and be used, in order to smooth current flow.

FIGS. 1A and 1B show a stacked structure of a light emitting diode according to one embodiment of the related art and a plan view viewing the light emitting diode from above.

Referring to FIG. 1A, an n-type semiconductor layer 101 made of material such as n-GaN, etc., a light emitting layer 102, and a p-type semiconductor layer 103 made of p-GaN, etc., are sequentially stacked on a substrate 100, wherein on a region of the n-type semiconductor layer 101 is provided an n-type electrode layer 105 having the same n-type, and on a region of the p-type semiconductor layer 103 is formed a transparent electrode layer 104 and on the transparent layer 104 is formed a p-type electrode layer 106 having the same p-type.

Generally, the n-type electrode layer 105 is applied with negative (−) power supply and the p-type electrode layer 106 is applied with positive (+) power supply to apply forward voltage to the light emitting diode, emitting light.

The plan view viewing the structure from above is the same as FIG. 1B, wherein the n-type electrode layer 105 and the p-type electrode layer 106 has a form that they are generally symmetrical or disposed in a row, the n-type electrode layer 105 and the p-type electrode layer 106 each being formed inside the same types of semiconductor layers.

FIG. 3A shows a circuit view of a conventional light emitting diode. A conventional diode serves as a resistor R1 when current flows, wherein when forward power supply is applied, the diode weakly acts as a resistor to allow current flow from a p-type semiconductor to an n-type semiconductor, and when reverse power supply is applied, the diode strongly acts as a resistor to allow current flow from the n-type semiconductor to the p-type semiconductor.

A structure of a light emitting diode and a form thereof may be a light emitting diode in a wire bonding structure where they are sequentially stacked according to a bonding manner to be provided in a circuit substrate, or be a light emitting diode in a flip-chip bonding structure (hereinafter, referred to as 'flip-chip light emitting diode') as shown in FIG. 6.

Referring to FIG. 6, the flip-chip light emitting diode is not different either from the conventional light emitting diode in view of the stacked structure, and the flip-chip light emitting diode merely turns upside down the stacked light emitting diode to bond it to an auxiliary substrate 608 using a solder ball 607 between the respective electrode layers 605 and 606 and the auxiliary substrate.

The light emitting diode itself of the conventional light emitting diode cannot but act as one resistor so that when the magnitude of current applied to the light emitting diode is large, it is sensitive to electrical impact and its ability to endure electrostatic discharge is low, causing a problem that reliability on operation properties is deteriorated.

SUMMARY OF THE INVENTION

Therefore, it is an object of the present invention to provide a light emitting diode with resistance against electrostatic discharge and with high reliability on operation properties, in order to improve the operation properties sensitively driven according to the magnitude of electrostatic discharge of the light emitting diode of the related art and to solve the problem that reliability thereon is deteriorated.

It is another object of the present invention to provide a fabrication method of a light emitting diode with a high reliability having properties of high electrostatic discharge, using convenient and economic processes by improving a simple arrangement structure of electrode layers.

In order to accomplish the above objects, there is provided a light emitting diode with high electrostatic discharge comprising: a first electrode provided extending over an upper surface of a first semiconductor layer and an upper surface of a second semiconductor layer; a transparent electrode layer formed on the upper surface of the second semiconductor layer, spaced from the first electrode; and a second electrode layer provided on the upper surface of the transparent electrode layer.

In the present invention, the first semiconductor layer and the second semiconductor layer are different types of semiconductor layers doped with different types of impurities.

The first electrode may be a p-type electrode or an n-type electrode according to whether the first semiconductor layer is a p-type semiconductor layer or an n-type semiconductor layer.

Also, the second electrode may be a p-type electrode or an n-type electrode according to whether the second semiconductor layer is a p-type semiconductor layer or an n-type semiconductor layer.

In the present invention, the form of the first electrode is not specifically limited but it can be variously constituted, wherein preferably, a predetermined part of the first electrode extending over the second semiconductor layer may be a curved part.

In the present invention, the light emitting diode may be in a flip-chip structure. In other words, the light emitting diode of the present invention may be connected to an auxiliary substrate, in a flip-chip structure.

The parts of the second semiconductor layer exposed between the first electrode and the transparent electrode layer spaced therefrom may be formed as the parts having relatively high electric resistance by means of a plasma treatment or an oxidation treatment. Thereby, it may be expected an acting effect that reverse voltage properties between the first electrode and the second electrode are improved.

In order to accomplish the above objects, there is provided a fabrication method of a light emitting diode with high electrostatic discharge comprising the steps of: forming a first electrode extending over an upper surface of a first semiconductor layer and an upper surface of a second semiconductor layer stacked on the upper part of the first semiconductor layer; forming a transparent electrode layer on the upper surface of the second semiconductor layer, spaced from the first electrode; and forming a second electrode on the upper surface of the transparent electrode layer.

In the present invention, the method may further comprise the step of performing a plasma treatment or an oxidation treatment, etc. on the second semiconductor layer exposed between the first electrode and the transparent electrode layer spaced therefrom.

This is the reason that in order to minimize weak leakage current possibly flowing through the second semiconductor layer, the parts of the second semiconductor layer exposed between the first electrode and the second electrode are subject to the plasma treatment or the oxidation treatment to raise electric resistance, thereby improving reverse voltage properties.

In the present invention, the first semiconductor layer and the second semiconductor layer may be different types of semiconductor layers doped with different types of impurities. In other words, when the first semiconductor layer is a p-type semiconductor layer, the second semiconductor layer is an n-type semiconductor layer, and the reverse thereof is also possible.

In the present invention, the first electrode may be a p-type electrode or an n-type electrode according to whether the first semiconductor layer is a p-type semiconductor layer or an n-type semiconductor layer.

Also, the second electrode may be a p-type electrode or an n-type electrode according to whether the second semiconductor layer is a p-type semiconductor layer or an n-type semiconductor layer.

In the present invention, the form of the first electrode is not specifically limited but it is preferable that a predetermined part of the first electrode extending over the second semiconductor layer is be a curved part.

In the present invention, a light emitting layer may further be stacked between the first semiconductor layer and the second semiconductor layer stacked on the upper part of the first semiconductor layer.

In the present invention, after forming the second electrode, a bonding method bonding the first electrode and the second electrode to an auxiliary substrate, in a flip-chip manner, may further be comprised.

With the present invention as described above, there is provided a light emitting diode with high electrostatic discharge, being strong against electrostatic discharge, and with excellent reliability in operation properties even under a high voltage.

Also, properties of high electrostatic discharge in electronics, etc. including the light emitting diode are improved, making it possible to provide the electronics of high quality and of high performance.

A fabrication method of the light emitting diode is not different from a general fabrication method and merely changes an arrangement form of electrode layers to provide the light emitting diode with improved electrostatic discharge properties through a simple process, making it possible to expect economic value-added improvement effects.

Figure 1A:
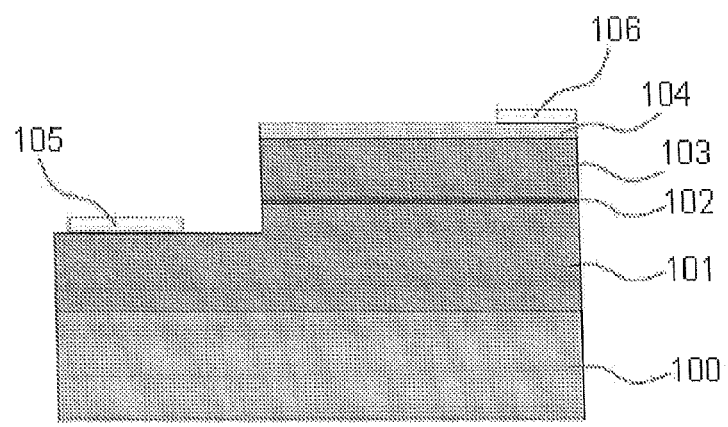
FIGS. 1A and 1B are a cross-sectional view and a plan view each showing a stacked structure of a light emitting diode according to one embodiment of the related art.
Figure 1B:
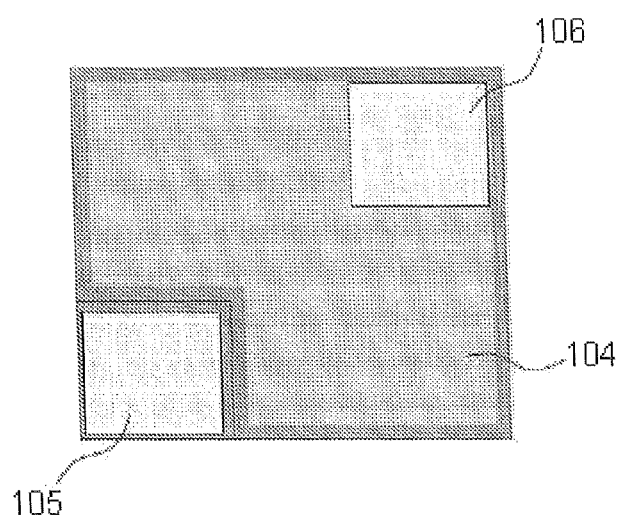

DESCRIPTION FOR KEY ELEMENTS IN THE DRAWINGS 100, 200, 600, 700: substrates
101, 201, 601, 701: n-type semiconductor layers
102, 202, 602, 702: light emitting layers
103, 203, 603, 703: p-type semiconductor layers
104, 204, 404, 504: transparent electrode layers
604, 704: reflective films
105, 205, 405, 505, 605, 705: n-type electrode layers
106, 206, 406, 506, 606, 706: p-type electrode layers
607, 707: solder balls
608, 708: auxiliary substrate

DETAILED DESCRIPTION

Hereinafter, preferred embodiments of the present invention will be described in detail with reference to the accompanying drawings. When inserting reference numerals into the constituents in the respective drawings, although the constituents are illustrated in different drawings, so far as the constituents are the same, they are described to have the same reference numeral, where possible. The detailed description for the well-known function and constitution, judged to make the gist of the invention obscure, will be omitted.

Figure 2A:
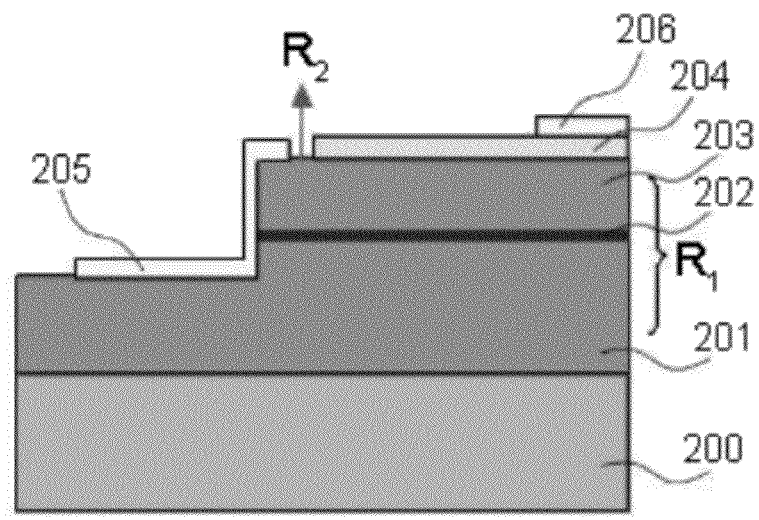
FIGS. 2A and 2B are a cross-sectional view and a plan view each showing a stacked structure of a light emitting diode according to one embodiment of the present invention.
Figure 2B:
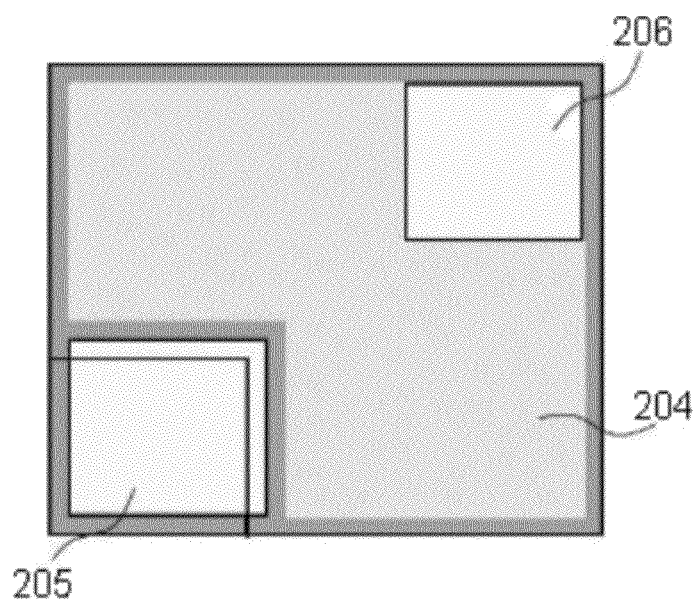

FIGS. 2A and 2B are a cross-sectional view and a plan view showing a stacked structure of a light emitting diode according to one embodiment of the present invention, respectively. Specifically referring to FIG. 2A, an n-type semiconductor layer 201, a light emitting layer 202, and a p-type semiconductor layer 203 are sequentially stacked on a substrate 200. This pn junction diode may act as one resistor R1 in a circuit.

As the constituting material of a semiconductor layer, any of materials constituting a mixed compound semiconductor may be used, wherein materials such as gallium nitride (GaN) and gallium arsenide (GaAS), etc. are preferable but are not always limited thereto.

A region of the n-type semiconductor layer 201 is provided with the same n-type electrode layer 205, and a region of the p-type semiconductor layer 203 is formed with a transparent electrode layer 204 capable of lowering contact resistance of the p-type semiconductor layer in order to smooth current flow. A p-type electrode layer 206, which is the same as the p-type semiconductor layer, is provided on the transparent electrode layer. In the present invention, although the n-type electrode layer 205 is provided in the region of the n-type semiconductor layer 201, it is provided extending over a portion of the region of the p-type semiconductor layer 203, including a lateral cross-sectional part where the n-type semiconductor layer 201, the light emitting layer 202 and the p-type semiconductor layer 203 are stacked.

Also, the transparent electrode layer 204 provided on the upper surface of the p-type semiconductor layer is stacked, having a predetermined interval with the n-type electrode layer 205 formed extending over a portion of the p-type semiconductor layer, wherein the p-type semiconductor layer 203 acts as a bulk resistor R2 when current flows through the p-type electrode layer 206 and the transparent electrode layer 204. When the bulk resistor is subject to a plasma treatment or an oxidation treatment, the value of R2 becomes large so that the current reversely flowing may be minimized and thereby, reverse voltage properties may be improved. In the present invention, the plasma treatment may include a method accelerating an ionized particle to collide with a surface of an object and to etch the surface thereof. The electric resistance on the surface of the semiconductor etched in this manner tends to be increased.

The electric resistance on the surface may also be increased by means of the oxidation treatment so that reverse voltage properties may be improved.

As one embodiment of the present invention, the plasma treatment or the oxidation treatment are subject to the region of the second semiconductor layer exposed between the first electrode and the second electrode to make the electric resistance thereon to be relatively higher than that on the second semiconductor layer of other parts so that the reverse voltage properties are improved. However, the present invention is not always limited to such a treatment but those skilled in the art may select another method capable of raising electric resistance, as a well-known technique.

Functions performed in a circuit by the bulk resistor R2 of the p-type semiconductor layer and the resistor R1 of the pn junction diode itself will be described below with reference to circuit view.

In the present invention, a form of the n-type electrode 205 provided extending over even a portion of the region of the p-type semiconductor layer 203 may be a straight line or a curved line, but is not always limited to a specific form. In other words, it is enough if the n-type electrode layer is provided and connected extending over the n-type semiconductor layer and the p-type semiconductor layer.

A plan view viewing a light emitting diode according to one embodiment of the present invention from above is as shown in FIG. 2B. Referring to FIG. 2B, an n-type electrode layer 205 and a p-type electrode layer 206 are usually diagonally symmetrical but are not always limited to such a structure.

Figure 3A:
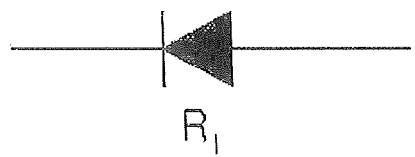
FIGS. 3A and 3B are a circuit view of a light emitting diode according to one embodiment of the related art and a circuit view of a light emitting diode according to one embodiment of the present invention.
Figure 3B:
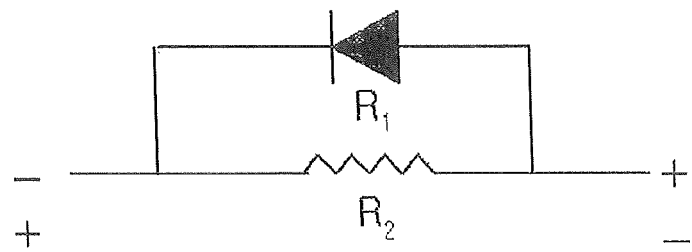

A circuit view according to a structure of a light emitting diode according to one embodiment of the present invention is shown in FIG. 3B.

FIG. 3A is a circuit view of a light emitting diode of the related art, as previously described.

Generally, if an n-type electrode layer is applied with negative (−) power supply and a p-type electrode layer 206 is applied with positive (+) power supply, it means that forward voltage is applied to a light emitting diode. At this time, since current flows from a p-type semiconductor to an n-type semiconductor, a resistance R1 of the diode itself is lowered. However, to the contrary, if the n-type electrode layer is applied with the positive (+) power supply and the p-type electrode layer is applied with the negative (−) power supply, current reversely flows due to reverse voltage so that resistance R1 becomes very great.

However, the light emitting diode of the present invention is provided on the p-type semiconductor, having a predetermined gap between the n-type semiconductor and a transparent electrode layer so that it forms a circuit view where a bulk resistor R2 of the p-type semiconductor layer and the resistor R1 of a pn junction diode itself are connected in parallel when current flows.

Generally, the resistance of the p-type semiconductor is greatly higher than the resistance of the n-type semiconductor.

The bulk resistor R2 of the p-type semiconductor layer has a constant value regardless of directions of (+) (−) power supplies.

If forward ((+) is applied to the p-type electrode layer of the p-type semiconductor layer and (−) is applied to the n-type electrode layer of the n-type semiconductor layer) current is applied to the resistor R1 of the pn junction diode itself, the current moderately moves from the p-type semiconductor layer to the n-type semiconductor layer, having a light emitting layer therebetween.

At this time, since the resistance R1 is much lower than the resistance R2 (R2>>R1), most of the current flows through the R1 so that there is no problem in the operation of the light emitting diode and if a high voltage is applied, a portion of the current flows through the R2 so that electrical impact involved in the R1 is somewhat decreased, making it possible for the light diode to endure high electrostatic discharge.

To the contrary, if reverse ((−) is applied to the p-type electrode layer of the p-type semiconductor layer and (+) is applied to the n-type electrode layer of the n-type semiconductor layer) current is applied, since a depletion layer is formed centering on the light emitting layer, the light emitting layer itself acts as a very great resistance so that R1, the entire pn junction diode resistance, has a much greater value than R2 (R2<<R1). In this case, most of the current will flow through the R2 and thus, although a high voltage reversely flows, a large voltage is not involved in the light emitting diode, making it possible to well endure.

The present invention has a structure where a resistance path capable of avoiding current flow at a fixed voltage is provided on the light emitting diode so that it can provide a light emitting element with reliability having resistance against a large voltage, even without adding a separate apparatus.

Figure 4:
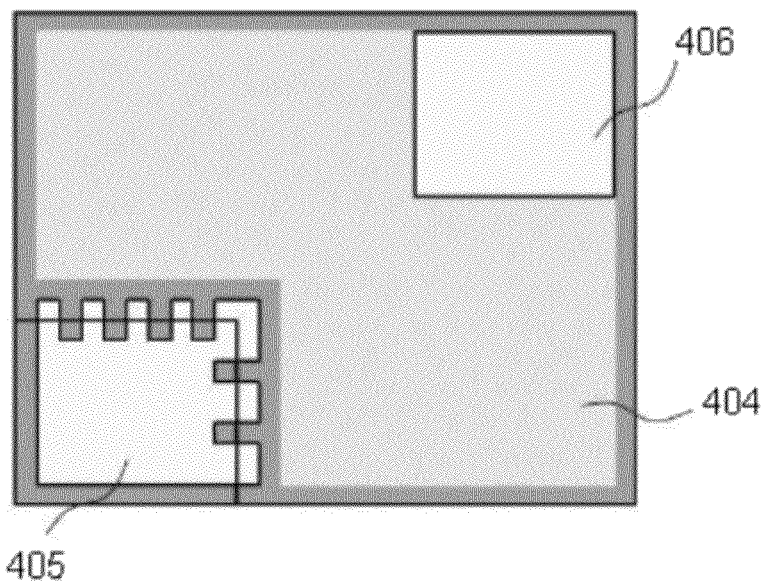
FIGS. 4 and 5 are plan view showing electrode forms of a light emitting diode according to one embodiment of the present invention.
Figure 5:
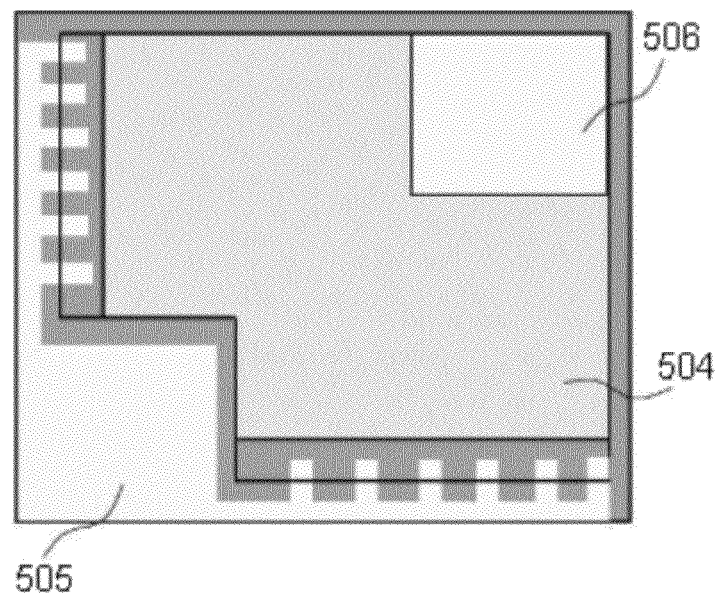

FIGS. 4 and 5 are plan view showing forms of n-type electrode layers 405 and 505 extending to a region of a p-type semiconductor layer in a light emitting diode according to one embodiment of the present invention.

Referring to the drawings, in the n-type electrode layers 405 and 505 of the present invention the forms of the surfaces extending over the p-type semiconductor layer may be a straight line or a curved line, but they may preferably be a form including uneven parts.

The uneven parts may be in a right-angled shape or a curved shape.

FIG. 4 shows a form where the n-type electrode layer 405 is a square, of which two sides extending over the region of the p-type semiconductor layer form the uneven parts.

Meanwhile, FIG. 5 shows a form where the n-type electrode layer 505 is a wing shape, wherein surfaces of long wings of the parts extending over a region of the p-type semiconductor layer have the uneven parts.

The n-type electrode layer having these uneven parts may be formed in one or more of plural numbers.

Figure 7:
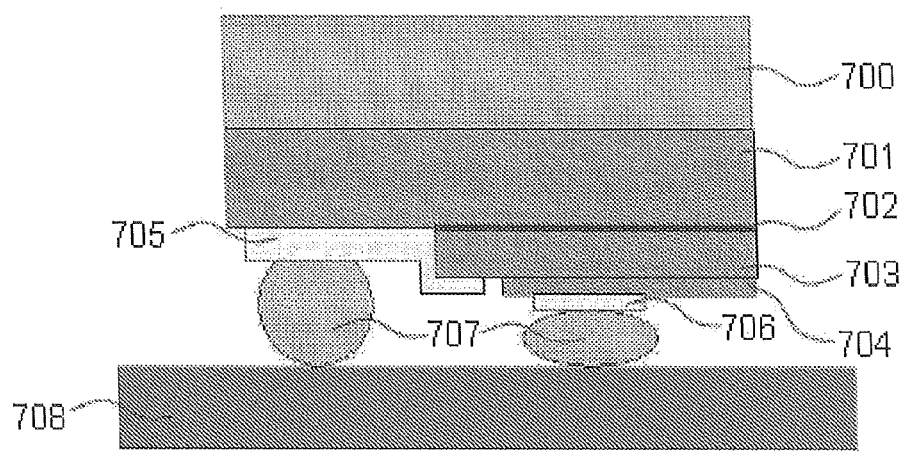
FIG. 7 is a lateral cross-sectional view of a light emitting diode in a flip-chip manner according to one embodiment of the present invention.

FIG. 7 is a cross-sectional view of a light emitting diode with a flip-chip bonding structure according to one embodiment of the present invention.

Figure 6:
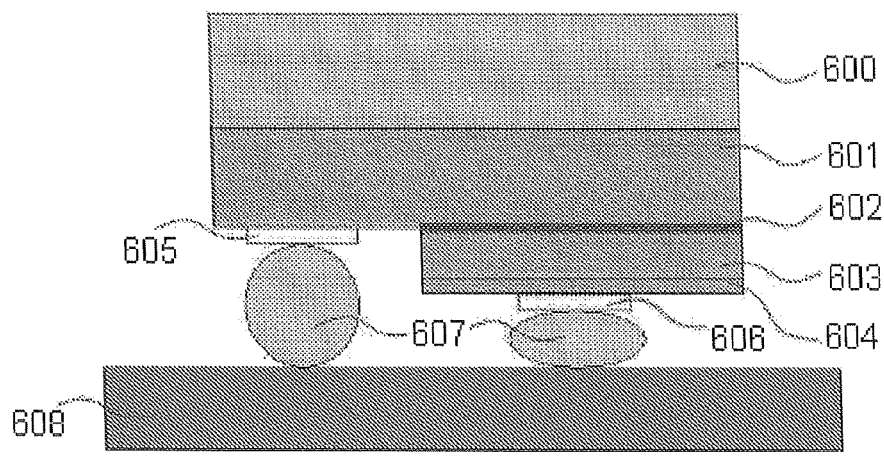
FIG. 6 is a lateral cross-sectional view of a light emitting diode in a flip-chip manner according to one embodiment of the related art.

FIG. 6 shows a flip-chip bonding structure of a conventional light emitting diode. As compared with it, an n-type electrode layer 705 according to one embodiment of the present invention is included in a region of an n-type semiconductor layer 701 and is formed extending over a lateral cross-section of a light emitting layer 702 and a p-type semiconductor layer 703. The n-type electrode layer 705 and the p-type electrode layer 706 are connected to a substrate 708 by interposing a solder boll 707. Those skilled in the art will appreciate that the specific embodiments disclosed in the foregoing description may be readily utilized as a basis for modifying or designing other embodiments for carrying out the same purposes of the present invention. Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

With the present invention as described above, there is provided a light emitting diode with high electrostatic discharge, being strong against electrostatic discharge, and with excellent reliability in operation properties even under a high voltage.

Also, properties of high electrostatic discharge in electronics, etc. including the light emitting diode are improved, making it possible to provide the electronics of high quality and of high performance.

A fabrication method of the light emitting diode is not different from a general fabrication method and merely changes an arrangement form of electrode layers to provide the light emitting diode with improved electrostatic discharge properties through a simple process, making it possible to expect economic value-added improvement effects.

What is claimed is:

1. A light emitting diode with high electrostatic discharge, comprising:
    a first electrode provided over an upper surface of a first semiconductor layer and an upper surface of a second semiconductor layer;
    a transparent electrode layer formed on the upper surface of the second semiconductor layer, spaced from the first electrode; and
    a second electrode layer provided on the upper surface of the transparent electrode layer,
    wherein the parts of the second semiconductor layer exposed between the first electrode and the transparent electrode layer spaced therefrom are faulted as the parts having relatively high electric resistance by means of a plasma treatment or an oxidation treatment.

2. The light emitting diode with high electrostatic discharge as set forth in claim 1, wherein the first semiconductor layer and the second semiconductor layer are different types of semiconductor layers doped with different types of impurities.

3. The light emitting diode with high electrostatic discharge as set forth in claim 1, wherein the first electrode is a p-type electrode or an n-type electrode according to whether the first semiconductor layer is a p-type semiconductor layer or an n-type semiconductor layer.

4. The light emitting diode with high electrostatic discharge as set forth in claim 1, wherein the second electrode is a p-type electrode or an n-type electrode according to whether the second semiconductor layer is a p-type semiconductor layer or an n-type semiconductor layer.

5. The light emitting diode with high electrostatic discharge as set forth in claim 1, wherein the form of the first electrode has a predetermined part of the first electrode extending over the second semiconductor layer as a curved part.

6. The light emitting diode with high electrostatic discharge as set forth in claim 1, wherein the light emitting diode is in a flip-chip structure.

7. A fabrication method of a light emitting diode with high electrostatic discharge, comprising the steps of:
    forming a first electrode extending over an upper surface of a first semiconductor layer and an upper surface of a second semiconductor layer, stacked on the upper part of the first semiconductor layer;
    forming a transparent electrode layer on the upper surface of the second semiconductor layer, spaced from the first electrode; and
    forming a second electrode on the upper surface of the transparent electrode layer,
    further comprising the step of performing a plasma treatment or an oxidation treatment on the second semiconductor layer exposed between the first electrode and the transparent electrode layer spaced therefrom.

8. The fabrication method of the light emitting diode with high electrostatic discharge as set forth in claim 7, wherein the first semiconductor layer and the second semiconductor layer are different types of semiconductor layers doped with different types of impurities.

9. The fabrication method of the light emitting diode with high electrostatic discharge as set forth in claim 7, wherein the first electrode is a p-type electrode or an n-type electrode according to whether the first semiconductor layer is a p-type semiconductor layer or an n-type semiconductor layer.

10. The fabrication method of the light emitting diode with high electrostatic discharge as set forth in claim 7, wherein the second electrode is a p-type electrode or an n-type electrode according to whether the second semiconductor layer is a p-type semiconductor layer or an n-type semiconductor layer.

11. The fabrication method of the light emitting diode with high electrostatic discharge as set forth in claim 7, wherein the form of the first electrode has a predetermined part of the first electrode extending over the second semiconductor layer as a curved part.

12. The fabrication method of the light emitting diode with high electrostatic discharge as set forth in claim 7, further comprising stacking a light emitting layer between the first semiconductor layer and the second semiconductor layer, stacked on the upper part of the first semiconductor layer.

13. The fabrication method of the light emitting diode with high electrostatic discharge as set forth in claim 7, after forming the second electrode, further comprising the step of bonding the first electrode and the second electrode to an auxiliary substrate, in a flip-chip manner.

* * * * *